US006875032B2

(12) United States Patent
Tsuchiya

(10) Patent No.: US 6,875,032 B2
(45) Date of Patent: Apr. 5, 2005

(54) CIRCUIT BOARD TERMINAL

(75) Inventor: Takashi Tsuchiya, Yokkaichi (JP)

(73) Assignee: Sumitomo Wiring Systems, Ltd. (JP)

( * ) Notice: Subject to any disclaimer, the term of this patent is extended or adjusted under 35 U.S.C. 154(b) by 0 days.

(21) Appl. No.: 10/459,303

(22) Filed: Jun. 11, 2003

(65) Prior Publication Data

US 2003/0236009 A1 Dec. 25, 2003

(30) Foreign Application Priority Data

Jun. 12, 2002 (JP) ....................................... 2002-170935

(51) Int. Cl.$^{7}$ ................................................ H05K 1/00
(52) U.S. Cl. ......................................... 439/82; 439/751
(58) Field of Search ............................ 439/82, 751, 79, 439/80, 81

(56) References Cited

U.S. PATENT DOCUMENTS 4,867,710 A * 9/1989 Harting et al. .............. 439/751
5,487,684 A 1/1996 Schalk et al.
5,564,954 A 10/1996 Wurster
5,573,431 A 11/1996 Wurster
5,738,550 A * 4/1998 Sakuraoka et al. ......... 439/751
6,098,281 A * 8/2000 Rudi ........................... 29/845

FOREIGN PATENT DOCUMENTS

| | | |
|---|---|---|
| AT | 386 699 | 2/1988 |
| DE | 196 08 168 | 9/1997 |
| EP | 0 092 150 | 10/1983 |
| EP | 0 468 460 | 1/1992 |

* cited by examiner

*Primary Examiner*—Alex Gilman
(74) *Attorney, Agent, or Firm*—Gerald E. Hespos; Anthony J. Casella

(57) ABSTRACT

A circuit board terminal (10) has a board connecting portion (12) with a pair of resilient contacts (14) that bulge out with a deformation space (15) therebetween. A resiliently deformable strut (17) bridges the facing inner surfaces of the two resilient contacts (14). The board connecting portion (12) can be inserted into a through hole (23) in a circuit board (20). Thus, the resilient contacts (14) are pressed against the inner surface of the through hole (23) by a resilient force of the strut (17) acting in elongating directions and their own resilient forces acting in opening directions.

6 Claims, 8 Drawing Sheets

CIRCUIT BOARD TERMINAL

BACKGROUND OF THE INVENTION

1. Field of the Invention

The present invention relates to a terminal mountable on a circuit board.

2. Description of the Related Art

German Patent Publication No. 19608168 discloses a terminal that has a needle-eye shaped pair of resilient contacts that bulge arcuately out with a deformation space therebetween. The contacts of the terminal can be inserted into a through hole in a circuit board. As a result the resilient contacts deform and close. Resilient forces press the contacts in opening directions against the inner peripheral surface of the through hole to prevent the terminal from coming out. Thus, the resilient contacts establish electrical connection with the contact in the through hole without soldering.

The above-described terminal requires no soldering, and thus considerably simplifies the operation process. However, the terminal lacks a holding force.

An attempt has been made to thicken the resilient contacts to enhance the resilient forces. However, the opposite ends of the resilient contacts are supporting points of resilient deformation and excessively large stresses are created at the ends. Thus, the resilient contacts may undergo plastic deformation.

In view of the above problem, an object of the present invention is to provide a circuit board terminal with a high connection reliability.

SUMMARY OF THE INVENTION

The invention is a circuit board terminal that is insertable into an accommodation in a circuit board, such as a through hole, to establish electrical connection with a contact on the inner periphery of the accommodation. The terminal has at least one pair of resiliently deformable contacts with a deformation space therebetween. Thus, the resilient contacts can be brought into contact with the contact of the accommodation. At least one resiliently deformable strut is formed between opposed surfaces of the resilient contacts.

Insertion of the terminal into an accommodation, such as a through hole of the circuit board causes the strut to deform resiliently and further causes the resilient contacts to deform resiliently toward a closed position. The resilient contacts press against the inner surface of the through hole due to a resilient force of the strut and due to their own resilient forces that act in opening directions. Thus, terminal is held in the through hole and establishes electrical connection with the contact.

The resilient contacts press against the contact of the through hole with a resilient force that is a sum of their own resilient forces and the resilient force of the strut. Thus, a good withdrawal hindering force is obtained, and a highly reliable electrical connection is established between the terminal and the contact. Further, the resilient contacts have substantially the same thickness as the prior art. Thus, there is no possibility of plastic deformations due to stress concentrations.

The strut preferably is formed so that a front side with respect to an inserting direction into the through hole has a smaller resilient force than a rear side thereof. Thus, only a small insertion force is necessary. Operational efficiency is improved by reducing the insertion force while enhancing the withdrawal hindering force.

The strut may comprise a recessed or thinned portion and/or a window for having a locally smaller resistance force. Accordingly, the weakened portion with a smaller insertion force is easy to produce.

Radially outer portions of the resilient contacts in an undeformed state are cross-sectionally about 10 to 20% larger than an inside diameter of the contact portion of the accommodation. Accordingly, proper electric contact can be provided between the resilient contact and the respective contact portion of the accommodation while allowing for an easy insertion of the terminal fitting.

The strut preferably is substantially platelike, and hence can be produced easily.

The strut may extend substantially obliquely from one widthwise edge of one resilient contact to the other widthwise edge of the other resilient contact. Accordingly, the strut can be deformed easily with a tilting or twisting movement while ensuring a sufficient restoring force for pushing the resilient contacts against the contact portion of the accommodation.

The strut preferably is thinnest at its longitudinal center and is gradually thicker toward the opposite ends that are coupled to the resilient contacts.

The resilient contacts and the strut preferably are formed to have a substantially point-symmetrical cross section.

The resilient contacts each may comprise a substantially straight portion to be brought substantially into contact with the contact portion. Accordingly, a proper contact can be provided between the resilient contacts and the contact portion of the accommodation.

The circuit board terminal may further comprise a guide at its leading end for guiding the insertion of the circuit board terminal into the accommodation.

These and other objects, features and advantages of the present invention will become more apparent upon reading of the following detailed description of preferred embodiments and accompanying drawings. It should be understood that even though embodiments are separately described, single features thereof may be combined to additional embodiments.

DETAILED DESCRIPTION OF THE PREFERRED EMBODIMENTS

Figure 1:
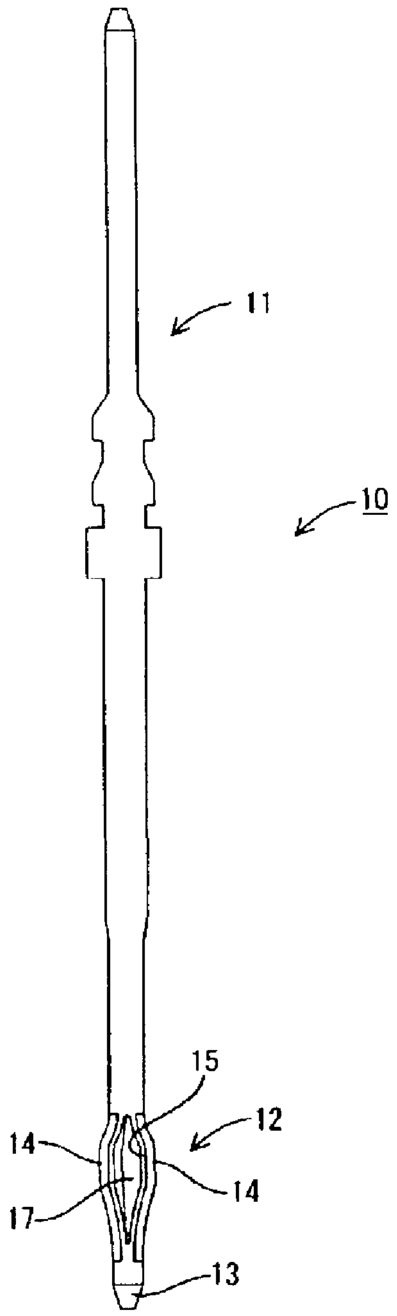
FIG. 1 is a front view of a terminal according to a first embodiment of the invention.
Figure 2:
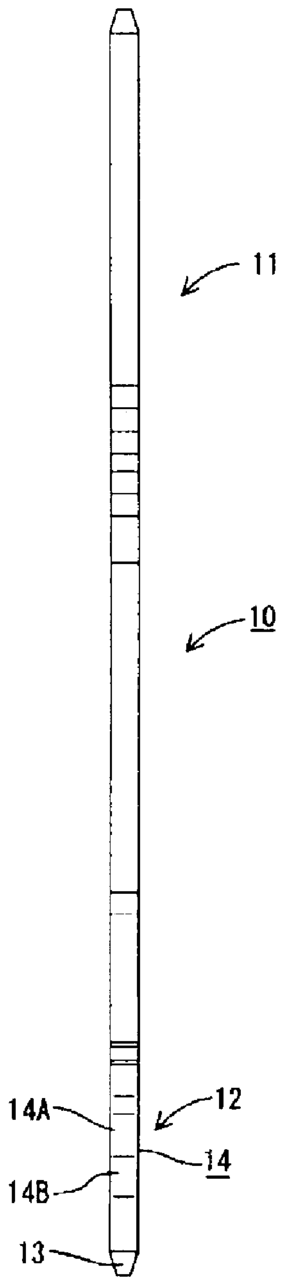
FIG. 2 is a side view of the terminal.

A press-fit terminal according to a first embodiment of the invention is identified by the numeral 10 in FIGS. 1 to 6. The terminal 10 is a long narrow rectangular bar, as shown in FIGS. 1 and 2, and is formed from a conductive metal wire. The terminal 10 has opposite first and second ends and can be bent between the ends into a substantially L-shape. A mounting portion 11 is disposed at the first end and can be pressed into an unillustrated connector for a circuit board. A board connecting portion 12 is disposed at the second end and The board connecting portion 12 of the terminal 10 has a tapered leading end 13 and two resilient contacts 14 above the tapered end 13. The resilient contacts 14 are thick strips that bulge out arcuately so that a deformation space 15 is defined between the resilient contacts 14. Outer surfaces of the resilient contacts 14 have substantially cylindrically generated portions 14A that are symmetrical about a common axis (see FIG. 4). The cylindrical portions 14A are slightly above the longitudinal center of the board connecting portion 12 and have lengths more than about one-fourth (preferably about one-third) the entire length of the resilient contacts 14. The two resilient contacts 14 are substantially opposed and are connected with each other at both ends. Additionally, the resilient contacts 14 are resiliently deformable in substantially radial directions to come closer or move away from each other.

Figure 4:
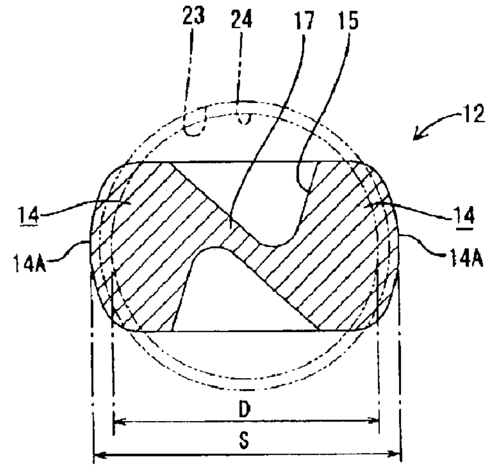
FIG. 4 is an enlarged section along 4—4 of FIG. 3.

A strut 17 extends between the substantially facing inner surfaces of the two resilient contacts 14. The strut 17 is substantially platelike and, as shown in FIG. 4, obliquely bridges one widthwise edge (upper edge in FIG. 4) of one resilient contact 14 (left one in FIG. 4) and the other widthwise edge of the other resilient contact 14. The strut 17 is thinnest at its longitudinal center and is gradually thicker toward the opposite ends coupled to the resilient contacts 14.

The two resilient contacts 14 and the strut 17 have a slightly flat Z- or N-shaped cross section, i.e. a substantially point-symmetrical cross section with respect to the longitudinal center line of the terminal fitting 10.

Figure 3:
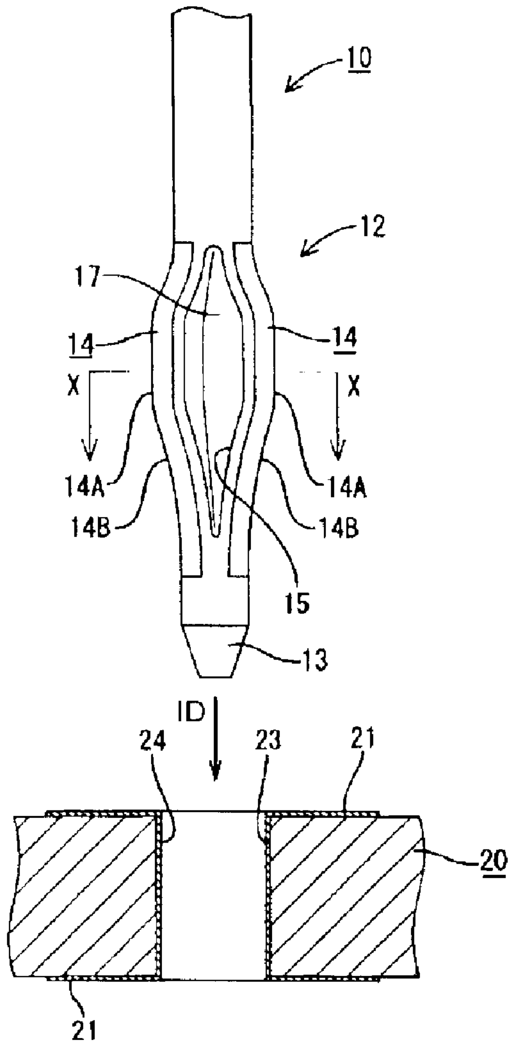
FIG. 3 is a front view partly in section showing an inserting operation of the terminal into a through hole formed in a printed circuit board.

The terminal 10 is used with a printed circuit board 20 that has conductive paths 21 on an outer surface and through holes 23 extending between opposite outer surfaces, as shown in FIG. 3. Contacts 24 are formed on the inner surfaces of the through holes 23 by, e.g. plating and are connected with the conductive paths 21. The board connecting portion 12 is insertable in an inserting direction ID into the through hole 23 of the printed circuit board 20. Each resilient contact 14 of the terminal 10 has a length substantially twice the depth of the through hole 23. Additionally, the cylindrical portions 14A of the resilient contacts 14 define an outside cross-sectional dimension S, in an unbiased state, that is about 10 to 20% larger than an inside diameter D of the contact 24 of the through hole 23, as shown in FIG. 4.

Figure 6:
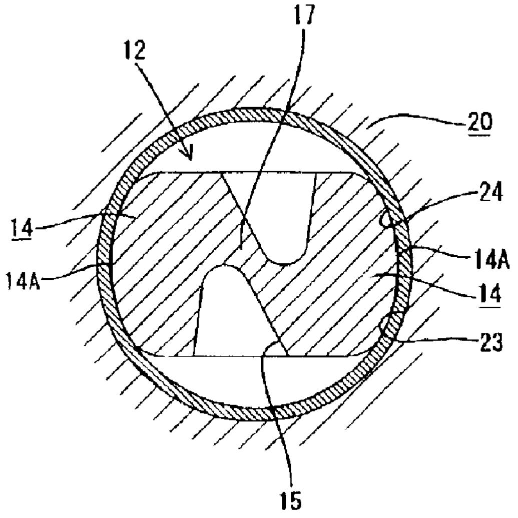
FIG. 6 is an enlarged section along 6—6 of FIG. 5.

The board connecting portion 12 of the terminal 10 can be inserted into the corresponding through hole 23 of the printed circuit board 20 in the inserting direction ID, as indicated by the arrow in FIG. 3. During the insertion, lower slanted portions 14B on the outer surfaces of the two resilient contacts 14 contact the upper opening edge of the through hole 23 and guide the board connecting portion 12 into the through hole 23. As the terminal 10 is pushed further, the resilient contacts 14 resiliently deform radially inwardly and come closer to each other, as shown in FIG. 6. At this time, the strut 17 is deformed compressively substantially along the bridging direction and changes its inclining direction. The resilient contacts 14 and the strut 17 have a substantially point-symmetrical cross section. Thus, the opposite sides of the board connecting portion 12 undergo equal resilient deformations. As a result, the board connecting portion 12 can be smoothly inserted into the through hole 23.

Figure 5:
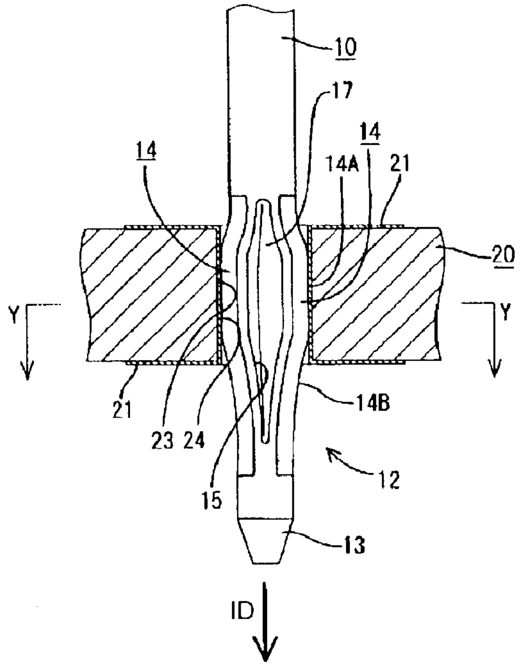
FIG. 5 is a front view partly in section showing a state where the inserting operation is completed.

Insertion of the board connecting portion 12 into the through hole 23 is stopped when the cylindrically generated portions 14A on the outer surface of the resilient contacts 14 reach half the depth of the through hole 23, as shown in FIG. 5. At this stage, the resilient contacts 14 are subjected to a resilient force of the strut 17 acting in elongating directions and their own resilient forces acting in radially outwardly opening directions. Thus, the cylindrically generated portions 14A are pressed against the inner surface of the through hole 23. As a result, the terminal 10 establishes an electrical connection with the contact 24 on the inner circumferential surface of the through hole 23 and is held so as not to come out.

The terminal 10 of this embodiment has two resilient contacts 14 pressed against the contact 24 of the through hole 23 with a large resilient force that is a sum of their own resilient forces and the resilient force of the strut 17. Thus, a frictional force is enhanced to prevent withdrawal of the terminal 10 from the through hole 23 and electrical connection with the contact 24 is established with high reliability. Further, the resilient contacts 14 have substantially the same thickness as the prior art and excessive resilient deformation of the resilient contacts is prevented by the strut 17. Thus, there is substantially no possibility of plastic deformation due to a concentration of stresses at the opposite ends of the terminal 10 along longitudinal directions as supporting points of the resilient deformation, and hence durability is improved.

Figure 7:
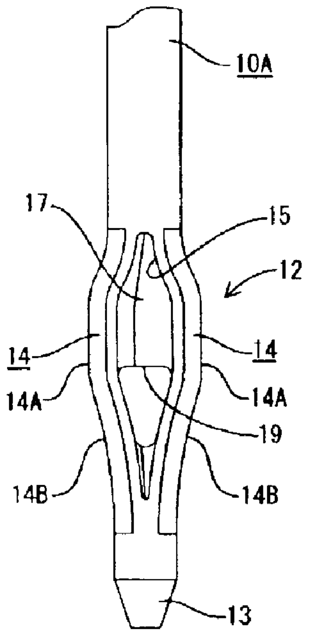
FIG. 7 is a partial front view of a terminal according to a second embodiment of the invention.
Figure 8:
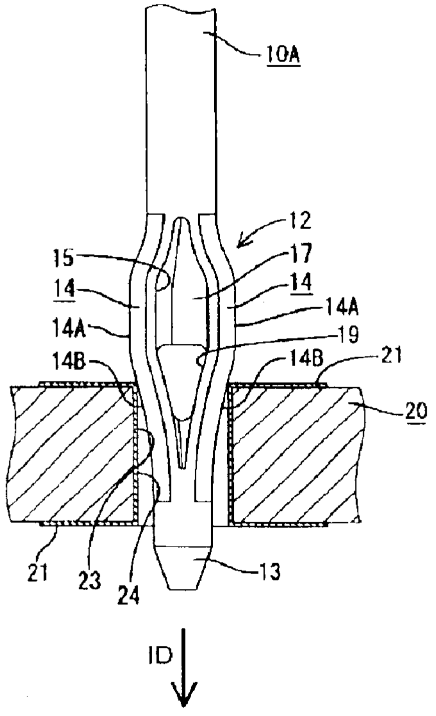
FIG. 8 is a front view partly in section showing an intermediate state of insertion into a through hole.
Figure 9:
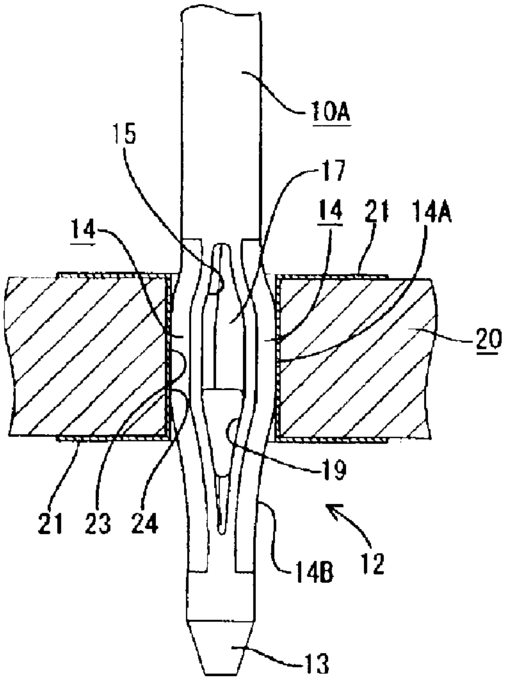
FIG. 9 is a front view partly in section showing a state where an inserting operation is completed.

A terminal according to a second embodiment of the invention is identified by the numeral 10A in FIGS. 7 to 9. The terminal 10A has a strut 17 formed between the substantially facing inner surfaces of both resilient contacts 14 and has a window 19 at a position corresponding to the inner sides of both lower slanted portions 14B.

The other construction is similar or same as in the first embodiment, and no repetitive description is given thereon by identifying elements having the same functions by the same reference numerals.

The board connecting portion 12 of the terminal 10A can be inserted into a corresponding through hole 23 of a printed circuit board 20. The lower slanted portions 14B of the resilient contacts 14 contact the upper opening edge of the through hole 23 and deform the resilient contacts 14 inwardly. However, a resilient force from the strut 17 acts less strongly because of the window 19 inwardly from the lower slanted portions 14B. Thus, the terminal 10A can be pushed and deformed with relative ease due to the lower slanted portions 14B of the resilient contacts 14, and can be pushed smoothly due to inertial force.

Insertion of the terminal 10A is stopped after the resilient contacts 14 reach a specified position in the through hole 23. Thus, the cylindrically generated portions 14A are pressed against the inner circumferential surface of the through hole 23 as shown in FIG. 9. The strut 17 is left inside and above the two straight portions 14A. Thus, the cylindrically generated portions 14A of the resilient contacts 14 press against the contact 24 of the through hole 23 and are subjected to their own resilient forces acting in opening directions and a resilient force of the strut 17 acting in elongating directions. As a result, the terminal 10A is prevented from coming out of the through hole 23.

The terminal 10A of the second embodiment has an improved insertion operability into the through hole 23 by enhancing a force for hindering the withdrawal from the through hole 23 while reducing an insertion force.

The invention is not limited to the above described and illustrated embodiments. For example, the following embodiments are also embraced by the technical scope of the present invention as defined by the claims. Beside the following embodiments, various changes can be made without departing from the scope and spirit of the present invention as defined by the claims.

The strut between the two resilient contacts can take an arbitrarily selected shape and orientation provided that it is resiliently deformable as the two resilient contacts are deformed to close or open.

Means other than thinning may be adopted to partly weaken the strut portion.

The invention has been described with reference to two resilient contacts. However, three or more resilient contacts may be provided. Two or more pairs of resilient contacts may be provided in point symmetry with respect to the longitudinal center axis of the terminal fitting with two or more struts connecting opposite resilient contacts so that the struts have a star-like cross-section.

The terminal fitting has been described as being insertable into a through hole. However, the invention also is applicable to terminal fittings to be inserted into recesses or bottomed holes, provided that these recesses or bottomed holes allow for the insertion to a depth sufficient to bring the resilient contacts into contact with the opening edge of the recesses or the bottomed holes thereby allowing for a deformation of the resilient contacts.

Even though the circuit board terminal has been described as being made of metal it could be made of electrically conductive plastic or plastic with an electrically conductive coating, provided that the material has a sufficient resiliency.

What is claimed is:

1. A circuit board terminal having a leading end insertable into an accommodation in a circuit board, a mounting portion spaced from the leading end and a board connection portion between the leading end and the mounting portion to establish an electrical connection with a contact portion formed on an inner surface of the accommodation, the board portion comprising:

first and second opposed resilient contacts having outwardly facing surfaces for electrical connection with the contact portion of the accommodation and inner surfaces substantially facing one another, the resilient contacts each having a first edge on a first side of the terminal fitting and a second edge on a second side of the terminal fitting, the resilient contacts being resiliently deformable substantially in radial directions towards and away from one another with a deformation space therebetween in order to contact the contact portion; and a substantially planar resiliently deformable strut formed between the inwardly facing surfaces of the resilient contacts, the resiliently deformable strut extending obliquely from the first edge of the first resilient contact to the second edge of the second resilient contact, a window being formed through portions of the resiliently deformable strut closest to the leading end of the terminal fitting so that the leading end of the board connecting portion is more easily deformable during insertion into the accommodation.

2. The circuit board terminal of claim 1, wherein radially outer portions of the resilient contacts in an undeformed state have an outside diameter about 10 to 20% larger than an inside diameter of the contact portion of the accommodation.

3. The circuit board terminal of claim 1, wherein the strut is thinnest at its longitudinal center and is gradually thicker toward the opposite ends coupled to the resilient contacts.

4. The circuit board terminal of claim 1, wherein the resilient contacts and the strut are substantially symmetrical about a longitudinal axis of the strut.

5. The circuit board terminal of claim 1, wherein the resilient contacts each comprise a substantially straight portion for contacting the contact portion.

6. The circuit board terminal of claim 1, further comprising a guide at the leading end for guiding the insertion of the circuit board terminal into the accommodation.

* * * * *